United States Patent
Peng et al.

(10) Patent No.: US 8,458,566 B2
(45) Date of Patent: Jun. 4, 2013

(54) METHOD FOR PERFORMING COPY BACK OPERATIONS AND FLASH STORAGE DEVICE

(75) Inventors: Chi-Wei Peng, Hsinchu County (TW); Chien-Chung Wu, Kaohsiung (TW); Hong-Ching Chen, Kao-Hsiung Hsien (TW)

(73) Assignee: Mediatek Inc., Hsin-Chu (TW)

( * ) Notice: Subject to any disclaimer, the term of this patent is extended or adjusted under 35 U.S.C. 154(b) by 399 days.

(21) Appl. No.: 12/759,822

(22) Filed: Apr. 14, 2010

(65) Prior Publication Data

US 2010/0332951 A1 Dec. 30, 2010

Related U.S. Application Data (60) Provisional application No. 61/221,569, filed on Jun. 30, 2009.

(51) Int. Cl.
*G11C 29/00* (2006.01)
(52) U.S. Cl.
USPC .......................................... 714/773; 714/54
(58) Field of Classification Search
USPC ................................... 714/773, 54
See application file for complete search history.

(56) References Cited

U.S. PATENT DOCUMENTS

| | | | |
|---|---|---|---|
| 7,012,835 B2 * | 3/2006 | Gonzalez et al. | 365/185.11 |
| 7,089,461 B2 * | 8/2006 | Gilbert et al. | 714/47.2 |
| 7,921,339 B2 * | 4/2011 | Chen et al. | 714/54 |
| 7,941,586 B2 * | 5/2011 | Kim | 711/103 |
| 7,958,430 B1 * | 6/2011 | Kolokowsky et al. | 714/763 |
| 8,078,923 B2 * | 12/2011 | Nagadomi et al. | 714/706 |
| 2007/0170268 A1 | 7/2007 | Lee | |
| 2008/0229000 A1 | 9/2008 | Kim | |
| 2009/0106513 A1 * | 4/2009 | Cheng et al. | 711/162 |
| 2009/0193058 A1 * | 7/2009 | Reid | 707/200 |
| 2010/0332900 A1 * | 12/2010 | Yang | 714/16 |
| 2010/0332943 A1 * | 12/2010 | D'Abreu et al. | 714/763 |

FOREIGN PATENT DOCUMENTS

TW 200919475 5/2009

* cited by examiner

*Primary Examiner* — Philip Guyton
(74) *Attorney, Agent, or Firm* — McClure, Qualey & Rodack, LLP (57) ABSTRACT

The invention provides a method for performing copy back operations. First, a copy back command is sent to a flash memory for reading a first error correction code (ECC) data from a first address. The first ECC data is then received from the flash memory. The first ECC data is then decoded without performing error correction to calculate a fail count of the first ECC data. The fail count is then compared with a first threshold value. When the fail count is less than the first threshold value, a first program command is sent to the flash memory for storing the first ECC data to a second address of the flash memory. When the fail count is less than the first threshold value, the first ECC data is not sent back to the flash memory.

17 Claims, 11 Drawing Sheets

METHOD FOR PERFORMING COPY BACK OPERATIONS AND FLASH STORAGE DEVICE

CROSS REFERENCE TO RELATED APPLICATIONS

This application claims the benefit of U.S. Provisional Application No. 61/221,569, filed on Jun. 30, 2009, the entirety of which is incorporated by reference herein.

BACKGROUND OF THE INVENTION

1. Field of the Invention

The invention relates to flash memories, and more particularly to copy back operations of flash memories.

2. Description of the Related Art

A flash storage device, such as a memory card, stores data for a host. When the host wants to store data, the host sends data to the flash storage device for storage. When the host requires data, the flash storage device retrieves the data stored therein and sends the data to the host. The flash storage device generally comprises a controller and a flash memory, wherein the flash memory is used for data storage and the controller receives access commands from the host and accesses data stored in the flash memory according to the access commands.

Figure 1:
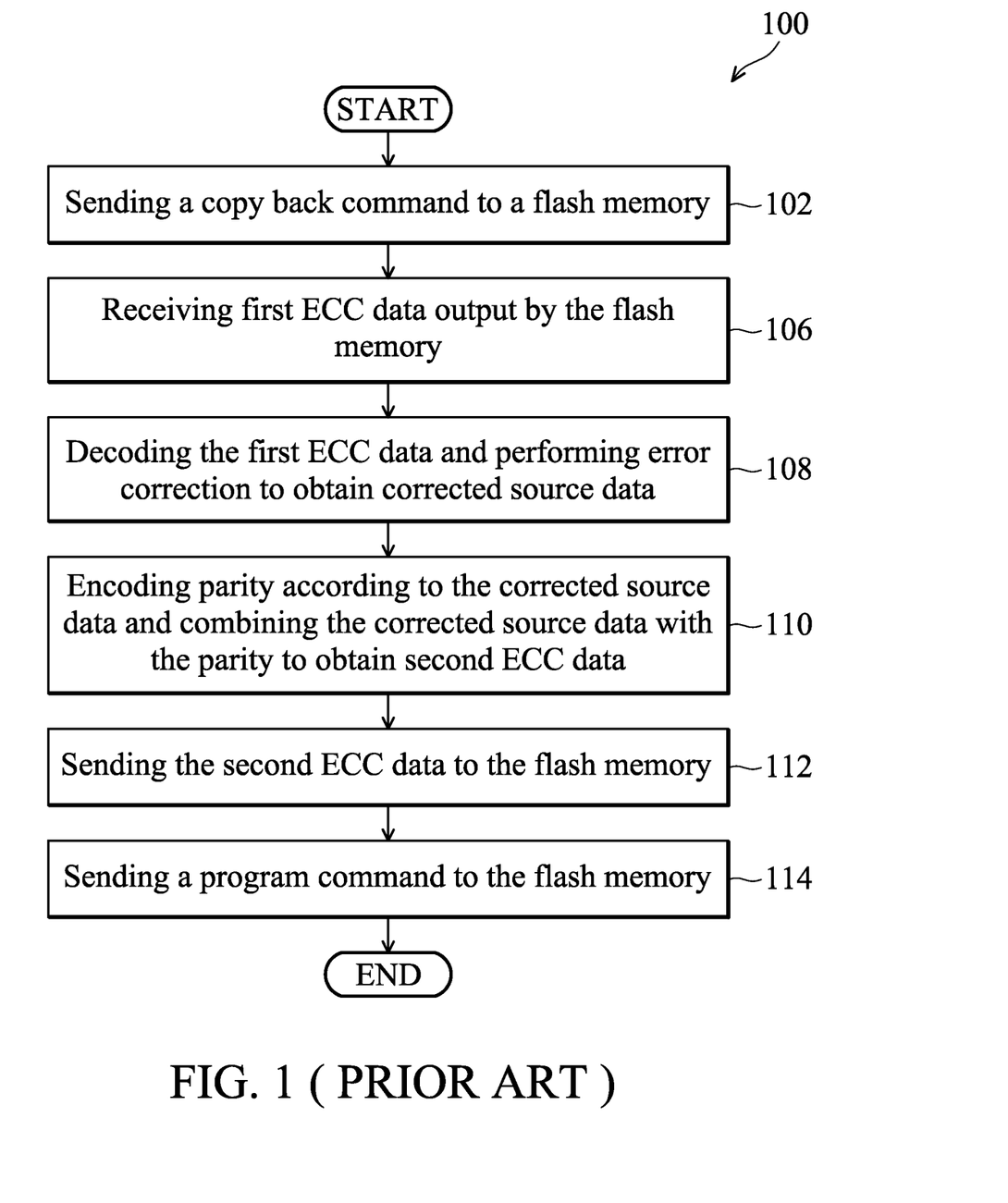
FIG. 1 is a flowchart of a method for executing a copy back command.

When a controller of a flash storage device wants to copy data stored at a first address of a flash memory to a second address of the flash memory, the controller often sends a copy back command to the flash memory. To prevent data from damage, data is ordinarily stored in an error correction code (ECC) format. Referring to FIG. 1, a flowchart of a method 100 for executing a copy back command is shown. The controller first sends a copy back command to the flash memory (step 102). When the flash memory receives the copy back command, the flash memory retrieves a first ECC data from the first address according to the copy back command, and then sends the first ECC data to the controller. The controller then starts to receive the first ECC data from the flash memory (step 106). The controller then decodes the first ECC data and performs error correction to obtain a corrected source data corresponding to the first ECC data (step 108). The controller then encodes a parity according to the corrected source data and then combines the corrected source data with the parity to obtain a second ECC data (step 110). The controller then sends the second ECC data to the flash memory (step 112). After the flash memory receives the second ECC data, the controller sends a program command to the flash memory to direct the flash memory to store the second ECC data to a second address (step 114).

Figure 2:
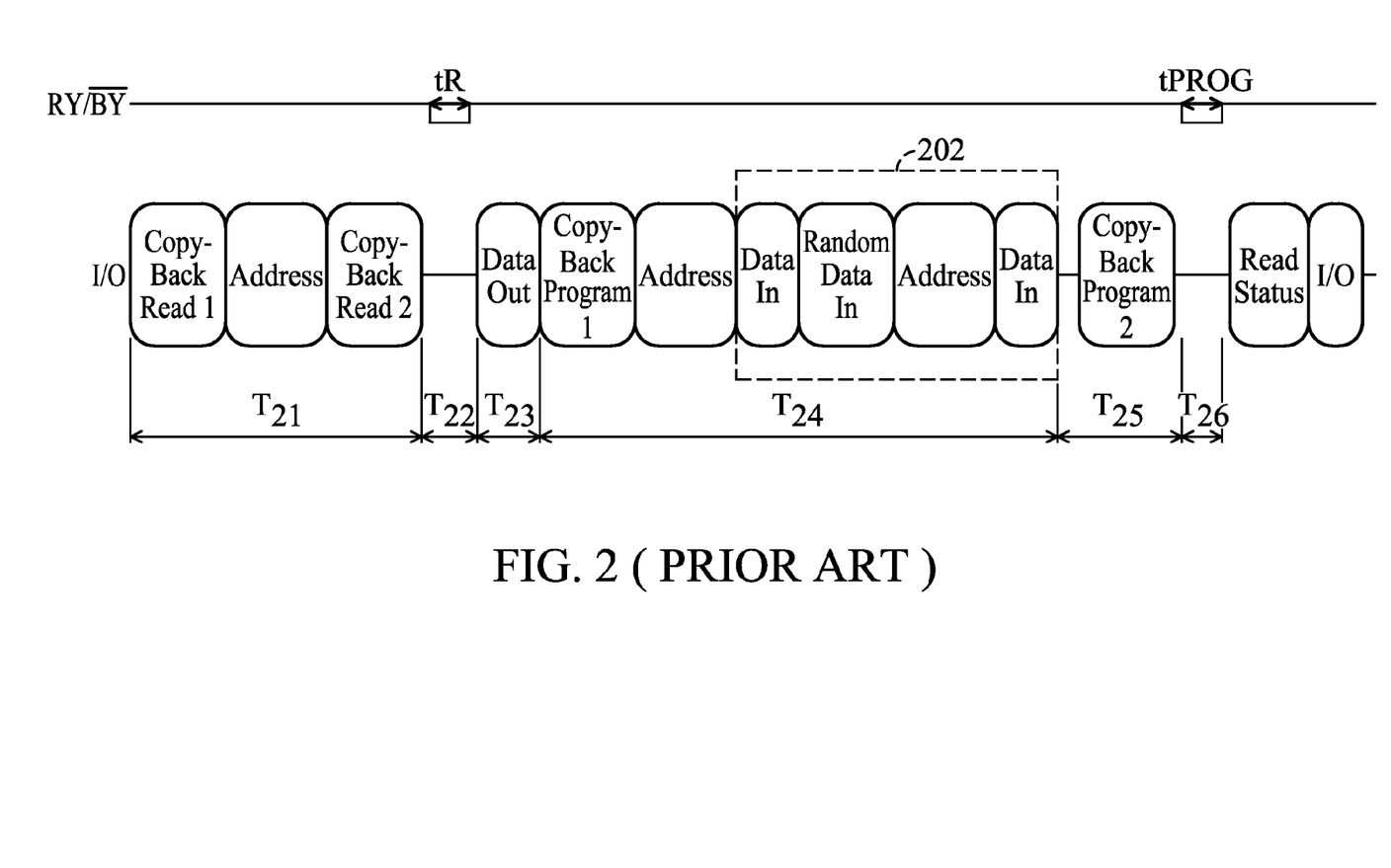
FIG. 2 is a schematic diagram of timing of signals transmitted between a controller and a flash memory for performing copy back operations.

Referring to FIG. 2, a schematic diagram of timing of signals transmitted between a controller and a flash memory for performing copy back operations is shown. During a time period $T_{21}$, the controller sends a copy back command comprising a first address to the flash memory via an input/output bus. During a time period $T_{22}$, the flash memory reads the first ECC data from the first address, and a ready/busy signal transmitted between the controller and the flash memory is pulled low while the first ECC data is being read. The flash memory then outputs the first ECC data to the controller via the I/O bus during a time period $T_{23}$. After the controller generates second ECC data according to the first ECC data, the controller then sends the second ECC data and a second address to the flash memory via the I/O bus during a time period $T_{24}$. The operations 202 are used for transmitting the second ECC data from the controller to the flash memory. The controller then sends a program command to the flash memory via the I/O bus during a time period $T_{25}$. During a time period $T_{26}$, the flash memory stores the second ECC data to the second address, and the ready/busy signal is pulled low while the second ECC data is being stored.

Transmission of the second ECC data from the controller to the flash memory in the operations 202, however, requires a long time period and causes delay to execution of the copy back command. In addition, if the first ECC data output by the flash memory contains no error bits, the first ECC data is identical to the second ECC data send from the controller to the flash memory, and transmission of the second ECC data is redundant. A method for executing copy back commands is therefore required to improve performance of a flash storage device.

BRIEF SUMMARY OF THE INVENTION

The invention provides a method for performing copy back operations. First, a copy back command is sent to a flash memory for reading a first error correction code (ECC) data from a first address. The first ECC data is then received from the flash memory. The first ECC data is then decoded without performing error correction to calculate a fail count of the first ECC data. The fail count is then compared with a first threshold value. When the fail count is less than the first threshold value, a first program command is sent to the flash memory for storing the first ECC data to a second address of the flash memory. When the fail count is less than the first threshold value, the first ECC data is not sent back to the flash memory.

The invention also provides a flash storage device. In one embodiment, the flash storage device comprises a flash memory and a controller. The flash memory stores a first error correction code (ECC) data at a first address. The controller sends a copy back command to the flash memory for reading the first ECC data, receives the first ECC data from the flash memory, decodes the first ECC data without performing error correction to calculate a fail count of the first ECC data, compares the fail count with a first threshold value, and sends a first program command to the flash memory for storing the first ECC data to a second address when the fail count is less than the first threshold value. The controller does not send the first ECC data back to the flash memory when the fail count is less than the first threshold value.

The invention also provides a method for performing copy back operations. First, a 2-plane copy back command is sent to a first flash memory and a second flash memory for reading a first error correction code (ECC) data and for reading a second ECC data. The first ECC data is then received from the first flash memory. The second ECC data is then received from the second flash memory. The first ECC data is then decoded to calculate a first fail count of the first ECC data. When the first fail count is less than a first threshold value, a first program command is sent to the first flash memory for storing the first ECC data to the flash memory. The second ECC data is then decoded to calculate a second fail count of the second ECC data. When the second fail count is less than the first threshold value, a second program command is sent to the second flash memory for storing the second ECC data to the second flash memory. The first ECC data is not sent back to the first flash memory when the first fail count is less than the first threshold value, and the second ECC data is not sent back to the second flash memory when the second fail count is less than the first threshold value.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
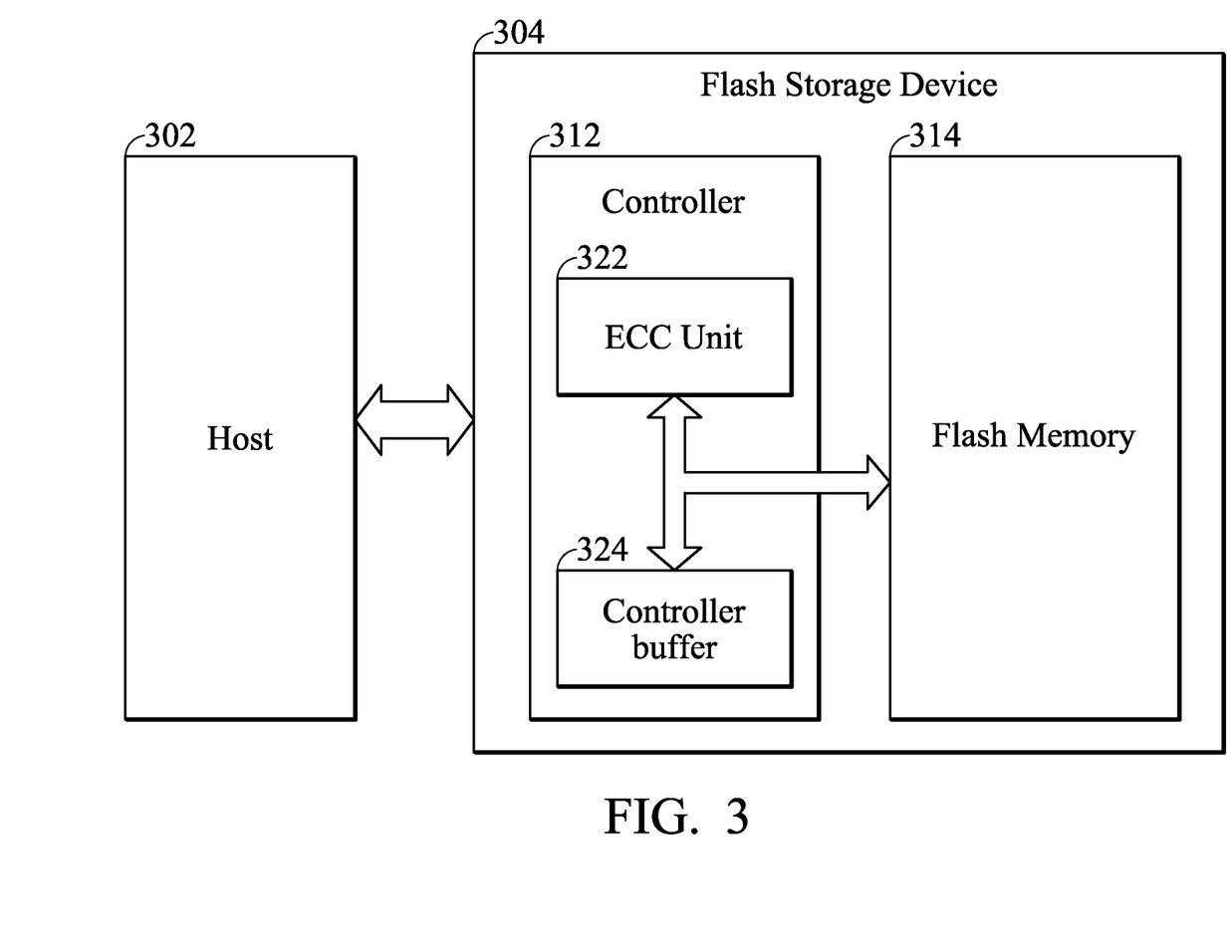
FIG. 3 is a block diagram of a flash storage device according to the invention.

Referring to FIG. 3, a block diagram of a flash storage device 304 according to the invention is shown. The flash storage device 304 is coupled to a host 302 and stores data for the host 302. In one embodiment, the flash storage device 304 comprises a controller 312 and a flash memory 314. The flash memory 314 is for data storage. The controller 312 receives access commands from the host 302 or accesses data stored in the flash memory 314 according to the access commands, wherein the data in the flash memory is stored in an error correction code (ECC) format. For example, the ECC format is a Bose and Ray-Chaudhuri (BCH) code format or a Reed-Solomon (RS) code format or a Low Density Parity Check (LDOC) code format. In one embodiment, the controller 312 comprises an ECC unit 322 and a memory (i.e. controller buffer 324). The ECC unit 322 is responsible for encoding and decoding error correction codes. When the host 302 sends write source data to the controller 312, the ECC unit 322 encodes ECC data according to the write source data. The ECC data is then sent to the flash memory, and the flash memory 314 then stores the ECC data. When the flash memory 314 reads ECC data stored therein and sends the ECC data to the controller 312, the ECC unit 322 decodes the ECC data to obtain read source data, and the controller 312 sends the read source data to the host 302.

Sometimes the controller 312 must copy ECC data stored in a first address of the flash memory 314 to a second address of the flash memory 314. The controller 312 can send a copy back command to the flash memory 314 to direct the flash storage device 304 to perform the aforementioned operations. It should be noted that the controller buffer 324 can be seen as a controller buffer used for storing the ECC data copied from the flash memory 314. The controller buffer 324 is different from the buffer implemented in the flash memory 314 (not shown), and can be implemented inside or outside the controller 312.

Figure 4:
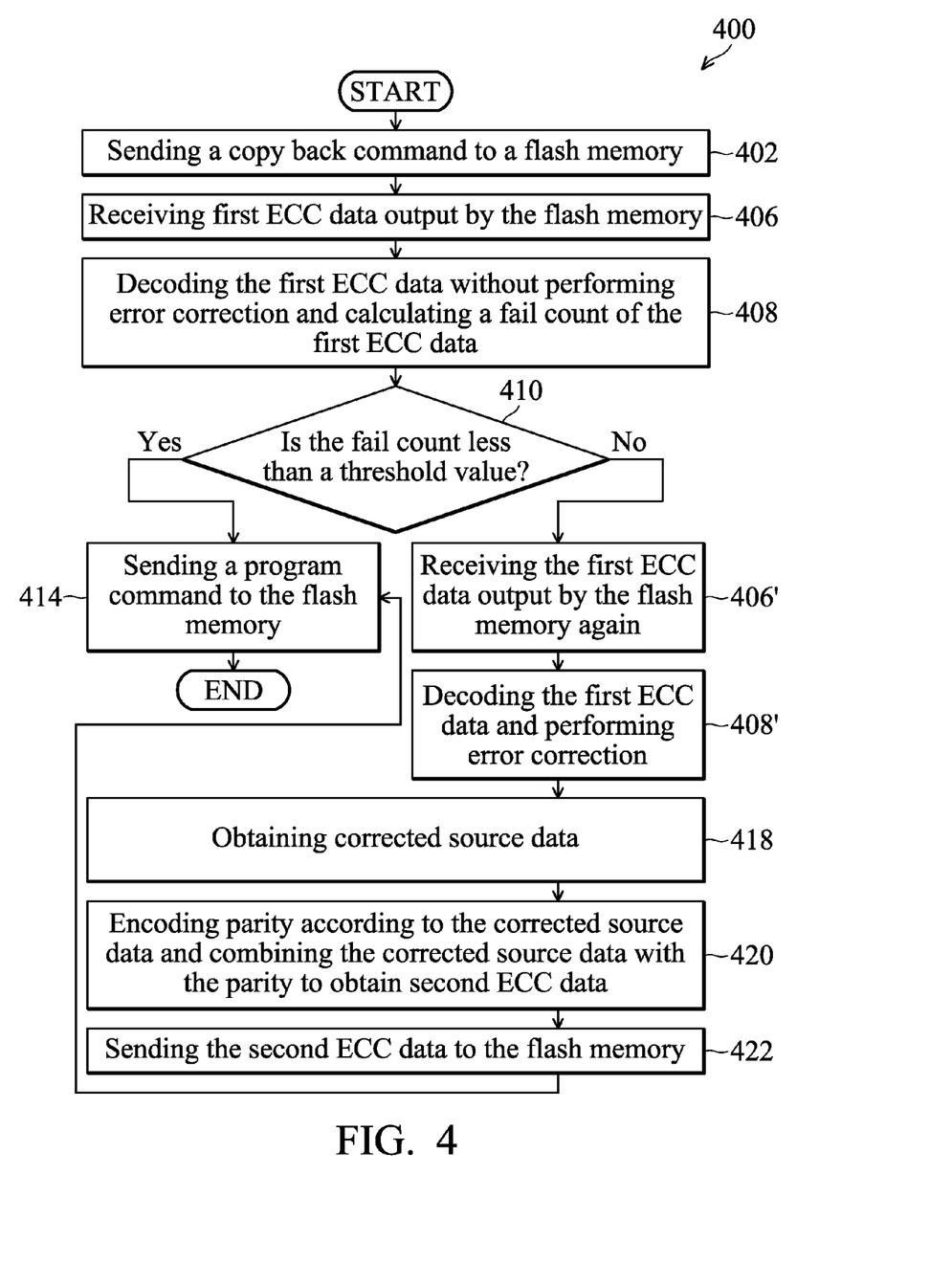
FIG. 4 is a flowchart of a method for performing copy back operations according to the invention.

Referring to FIG. 4, a flowchart of a method 400 for performing copy back operations according to the invention is shown. Wherein process from steps 402 through 410 to 414 can be seen as a 'without buffering procedure', and process from steps 410 to 422 can be seen as an 'error handling procedure'. First, the controller 312 sends a copy back command to the flash memory 314 (step 402). When the flash memory 314 receives the copy back command, the flash memory 314 retrieves a first ECC data from the first address according to the copy back command, and sends the first ECC data to the controller 312. The controller 312 then starts to receive the first ECC data from the flash memory 314 (step 406).

The ECC unit 322 of the controller 312 then decodes the first ECC data (step 408). Unlike the step 108 shown in FIG. 1, the ECC unit 322 does not perform error correction to correct errors of source data of the first ECC data. Instead, the ECC unit 322 calculates a fail count of the first ECC data according to the decoded result of the first ECC data (step 408). The controller 312 then compares the fail count with a threshold value (step 410). When the fail count is less than the threshold value, the first ECC data comprises few errors or no errors. Thus, the controller 312 determines that the first ECC data requires no error correction. The controller 312 then directly sends a program command to the flash memory 314 (step 414). Because the flash memory 314 stores the first ECC data in a flash buffer (not shown) inside the flash memory 314, when the flash memory 314 receives the program command from the controller 312, the flash memory 314 directly writes the first ECC data stored in the flash buffer to a second address according to the program command. Thus When the fail count of the first ECC data is greater than the threshold value (step 410), the controller 312 needs to receive the first ECC data outputted from the flash memory 314 again (step 406'), and then the ECC unit 322 decodes the first ECC data with performing error correction (step 408'). The ECC unit 322 then corrects errors of the first ECC data to obtain corrected source data corresponding to the first ECC data (step 418). The ECC unit 322 then encodes parity according to the corrected source data and then combines the corrected source data with the parity to obtain a second ECC data (step 420). The controller 312 then sends the second ECC data to the flash memory 314 (step 422). After the flash memory 314 receives the second ECC data, the controller 312 sends a program command to the flash memory 314 to direct the flash memory 314 to store the second ECC data to the second address (step 414). It should be noted that if the first ECC data received by the controller 312 is already stored in the controller buffer 324 at step 406, the controller 312 doesn't need to receive the first ECC data again, thus the step 406' can be omitted. Moreover, if result of decoding the first ECC data is already stored in the controller buffer 324 at step 408, the controller 312 doesn't need to decode the first ECC data at step 408', thus the step 408' only performs error correction.

Thus, in comparison with the conventional method 100 shown in FIG. 1, when the fail count is less than the threshold value, the controller 312 does not perform error correction on the first ECC data, does not encode a second ECC data according to corrected source data corresponding to the first ECC data, and does not send the second ECC data to the flash memory 314. Thus, the time period to complete the copy back operation by the controller 312 is reduced. Also, the copy back operation is performed more efficiently than conventional methods to increase performance of the flash storage device 304.

Figure 5:
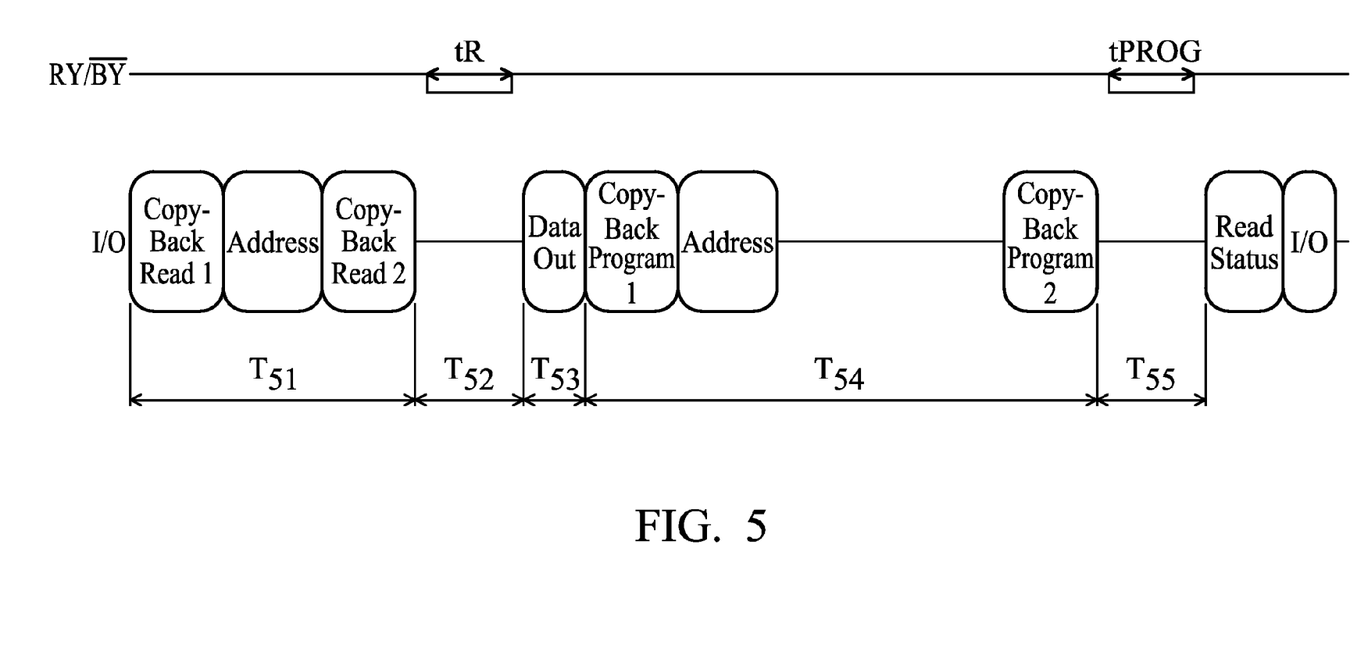
FIG. 5 is a schematic diagram of an embodiment of timing of signals transmitted between a controller and a flash memory for performing copy back operations according to the method shown in FIG. 4.

Referring to FIG. 5, a schematic diagram of an embodiment of timing of signals transmitted between the controller 312 and the flash memory 314 for performing copy back operations according to the method 400 shown in FIG. 4. During a time period $T_{51}$, the controller 312 sends a copy back command comprising a first address to the flash memory 314 via an input/output bus. During a time period $T_{52}$, the flash memory 314 reads the first ECC data from the first address, and the ready/busy signal transmitted between the controller 312 and the flash memory 314 is pulled low while the first ECC data is being read. The flash memory 314 then outputs a first ECC data to the controller 312 via the I/O bus during a time period $T_{53}$. The controller 312 then calculates a fail count of the first ECC data. If the fail count of the first ECC data is less than a threshold value, the controller 312 directly sends a program command to the flash memory 314 via the I/O bus during a time period $T_{54}$, wherein the program command comprises a second address. During a time period $T_{55}$, the flash memory 314 stores the first ECC data to the second address, and the ready/busy signal is pulled low while the first ECC data is being stored. In comparison with the signal timings shown in FIG. 2, the operations 202 for transmitting the second ECC data from the controller to the flash memory are omitted. Thus, the copy back operation shown in FIG. 5 is performed more efficiently than conventional methods.

Figure 6A:
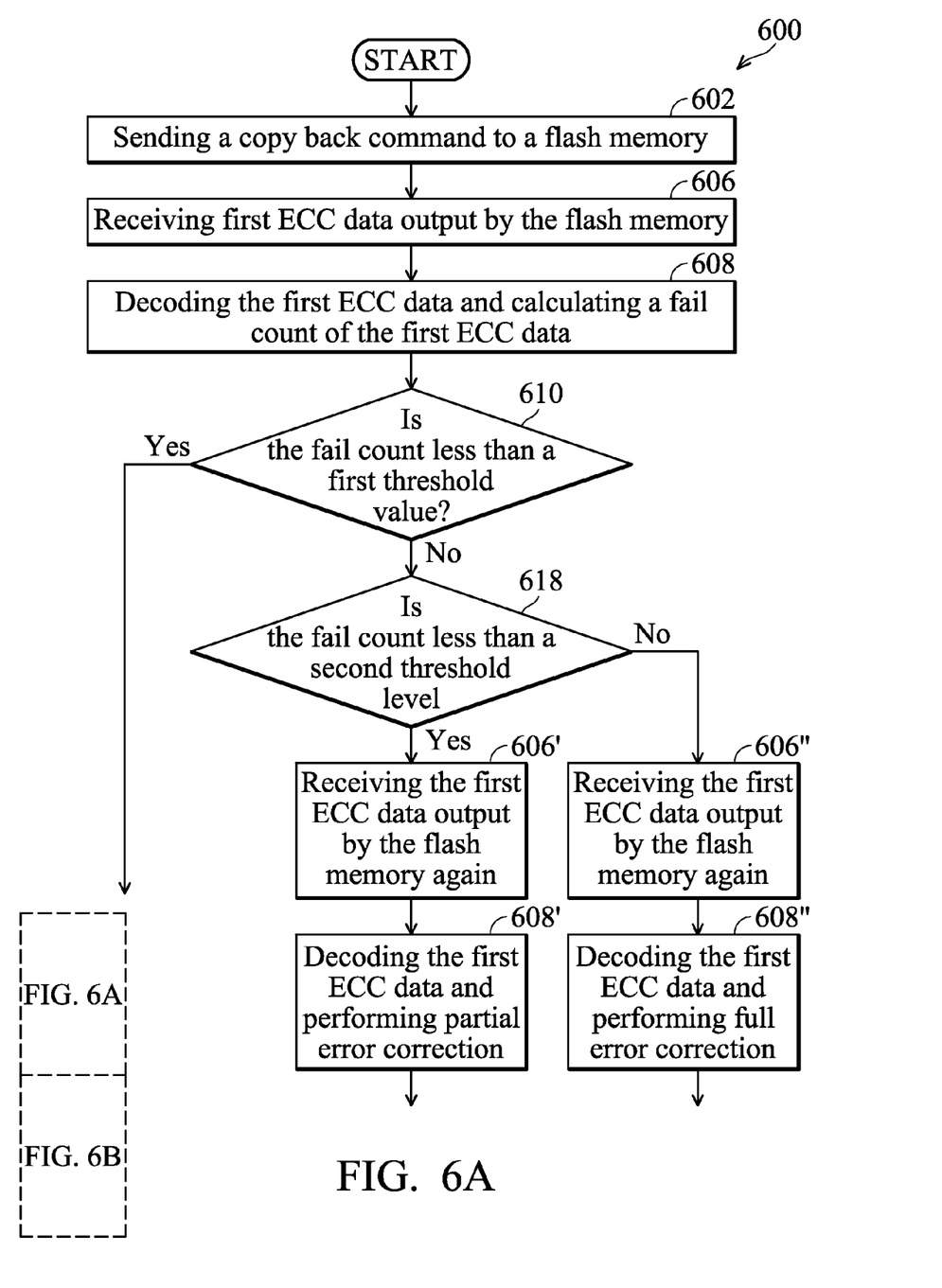
FIG. 6 is a flowchart of another embodiment of a method for performing copy back operations according to the invention.
Figure 6B:
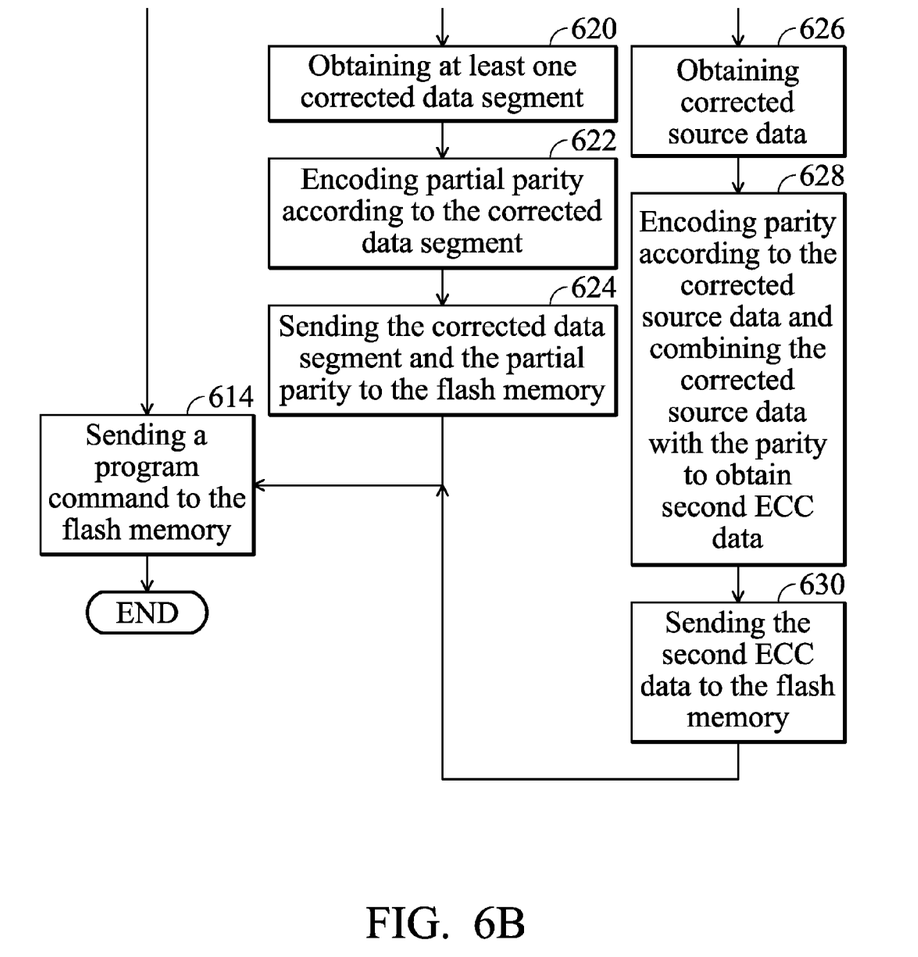

Referring to FIG. 6, a flowchart of another embodiment of a method 600 for performing copy back operations according to the invention is shown. Wherein process from steps 602 through 610 to 614 can be seen as a 'without buffering procedure', and processes from steps 610 to 624 or 630 can be seen as 'error handling procedures'. First, the controller 312 sends a copy back command to the flash memory 314 (step 602). When the flash memory 314 receives the copy back command, the flash memory 314 retrieves a first ECC data from the first address according to the copy back command, and sends the first ECC data to the controller 312. The controller 312 then starts to receive the first ECC data from the flash memory 314 (step 606). The ECC unit 322 of the controller 312 then decodes the first ECC data, and the ECC unit 322 then calculates a fail count of the first ECC data according to the decoded result of the first ECC data (step 608). The controller 312 then compares the fail count with a first threshold value (step 610). When the fail count is less than the first threshold value, the first ECC data comprises few errors or no errors, and the controller 312 determines that the first ECC data requires no error correction. The controller 312 therefore directly sends a program command to the flash memory 314 (step 614). Because the flash memory 314 stores the first ECC data in a buffer, when the flash memory 314 receives the program command from the controller 312, the flash memory 314 directly writes the first ECC data stored in the buffer to a second address according to the program command.

When the fail count of the first ECC data is greater than the first threshold value (step 610), the first ECC data comprises a few errors or many errors. The controller 312 therefore compares the fail count with a second threshold value (step 618), wherein the second threshold value is greater than the first threshold value. If the fail count is less than the second threshold value (step 618), the controller 312 determines that the first ECC data comprises some error segments which require correction. First, the controller receives the first data output by the flash memory 314 again (step 606'). The ECC unit 322 then decodes the first ECC data and performs partial error correction to determine at least one error segment comprising error bits from the first ECC data (step 608'). The ECC unit 322 then corrects error bits of the at least one error segment to obtain at least one corrected data segment (step 620). The ECC unit 322 then encodes a partial parity according to the corrected data segment (step 622). The controller 312 then sends the corrected data segment and the partial parity to the flash memory 314 (step 624), and then sends a program command to the flash memory 314 (step 614). When the flash memory 314 receives the program command, the flash memory 314 amends the first ECC data stored in a buffer according to the corrected data segment and the partial parity according to the program command, and then stores the amended first ECC data to the second address. Because the ECC unit 322 only needs to correct some error segments of the first ECC data and encode only the partial parity corresponding to the corrected data segment, workload of the ECC unit 322 is reduced. In addition, because the controller 312 only needs to transmit the corrected data segment and the partial parity to the flash memory 314, the entire time period for performing the copy back operation is reduced.

When the fail count increases, it means that the fail count of the first ECC data is greater than the second threshold value (step 618), the controller 312 determines that the first ECC data comprises many errors, and receives the first ECC data output by the flash memory 314 again (step 606"). The ECC unit 322 then decodes the first ECC data by performing full error correction (step 608"), and corrects errors of the first ECC data to obtain corrected source data corresponding to the first ECC data (step 626). The ECC unit 322 then encodes a parity corresponding to the corrected source data and then combines the corrected source data with the parity to obtain a second ECC data (step 628). The controller 312 then sends the second ECC data to the flash memory 314 (step 630). After the flash memory 314 receives the second ECC data, the controller 312 sends a program command to the flash memory 314 to direct the flash memory 314 to store the second ECC data to the second address (step 614).

From above description, when the fail count increases, the error correction of the 'error handling procedure' in the method 600 switches from partial error correction to be full error correction. It is noted that the 'error handling procedure' from steps 610 to 624, and the 'error handling procedure' from steps 610 to 630 process the same data (i.e. the first ECC data), thus the corrected data segment, the partial parity in step 624 and the second ECC data in the step 630 should be the same after these two error handling procedures respectively dealing with partial or full error correction.

Thus, in comparison with the conventional method 100 shown in FIG. 1, when the fail count is less than the first threshold value, the controller 312 does not perform error correction on the first ECC data, does not encode second ECC data according to corrected source data corresponding to the first ECC data, and does not send the second ECC data to the flash memory 314. Thus, the time period to complete the copy back operation by the controller 312 is reduced. Also, the copy back operation is performed more efficiently than conventional methods to increase performance of the flash storage device 304. It should be noted that if the first ECC data received by the controller 312 is already stored in the controller buffer 324 at step 606, the controller 312 doesn't need to receive the first ECC data again, thus the steps 606' and 606"

can be omitted. Moreover, if result of decoding the first ECC data is already stored in the controller buffer 324 at step 608, the controller 312 doesn't need to decode the first ECC data at steps 608' and 608", thus the step 608' only performs partial error correction, and the step 608" only performs full error correction. Comparing the method 600 in FIG. 6 with the method 400 in FIG. 6, the method 600 uses more threshold values than method 400, thus the method 600 should control the process more precisely and should have better efficiency.

According to the method 600 shown in FIG. 6, the controller 312 calculates a fail count of the first ECC data and then compares the fail count with a first threshold value and a second threshold value to determine a subsequent processing way of the first ECC data. When the fail count is lower than the first threshold value, no data is sent back to the flash memory 314 to execute a copy back command, and timings of signals for executing the copy back command is shown in FIG. 5. When the fail count is greater than the second threshold value, full error correction is performed to generate second ECC data sent back to the flash memory 314, and timings of signals for executing a copy back command is shown in FIG. 2. When the fail count is greater than the first threshold value and lower than the second threshold value, partial error correction is performed to generate a corrected data segment sent back to the flash memory 314, and timings of signals for executing a copy back command is shown in FIG. 7.

Figure 7:
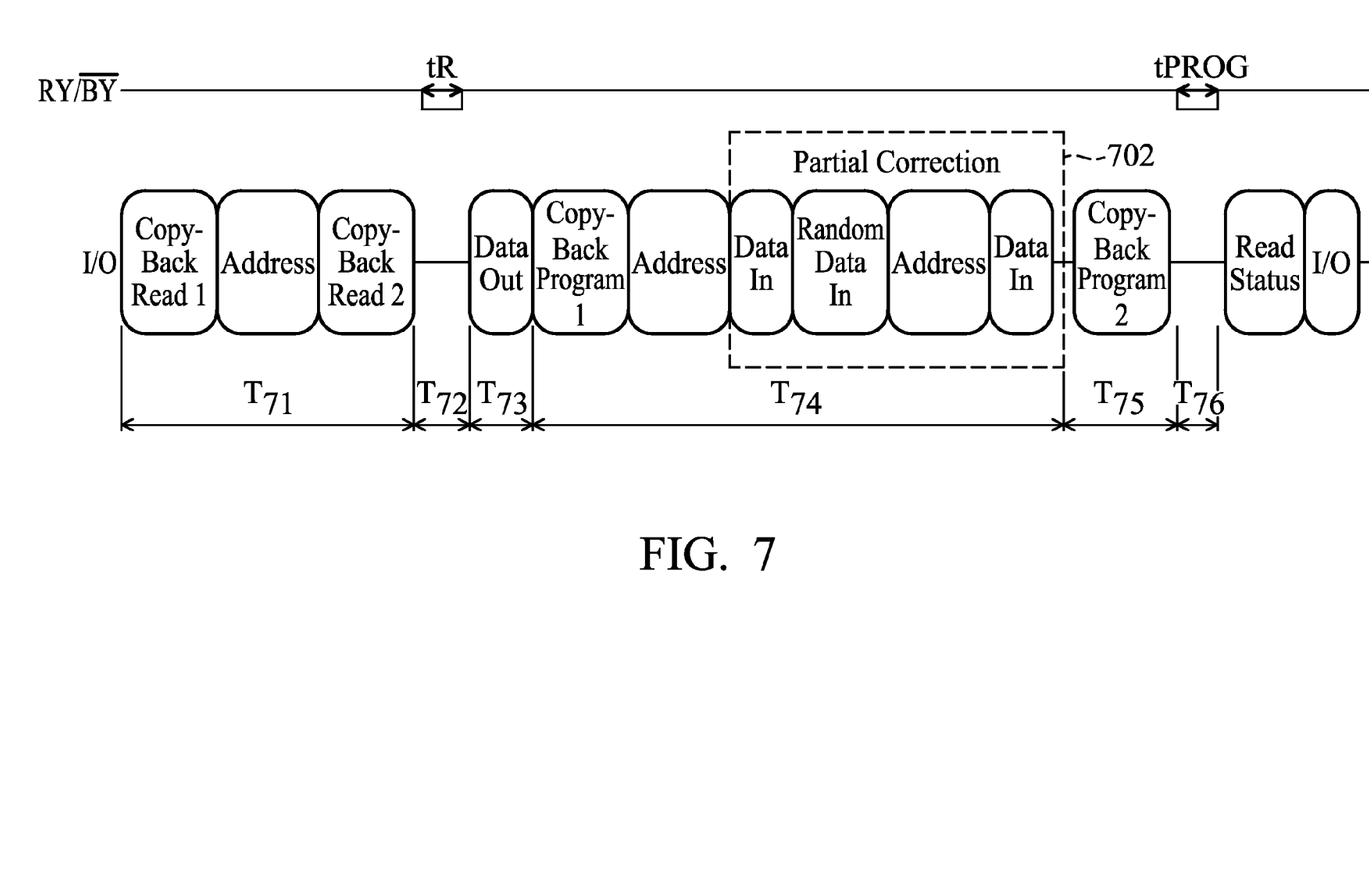
FIG. 7 is a schematic diagram of an embodiment of timing of signals transmitted between a controller and a flash memory for performing copy back operations according to the method shown in FIG. 6.

Referring to FIG. 7, a schematic diagram of an embodiment of timing of signals transmitted between the controller 312 and the flash memory 314 for performing copy back operations according to the method 600 shown in FIG. 6 is shown. During a time period $T_{71}$, the controller 312 sends a copy back command comprising a first address to the flash memory 314 via an input/output bus. During a time period $T_{72}$, the flash memory 314 reads the first ECC data from the first address, and a ready/busy signal transmitted between the controller 312 and the flash memory 314 is pulled low while the first ECC data is being read. The flash memory 314 then outputs first ECC data to the controller 312 via the I/O bus during a time period $T_{73}$. The controller 312 then calculates a fail count of the first ECC data. If the fail count of the first ECC data is greater than a first threshold value and lower than a second threshold value, the ECC unit 322 generates a corrected data segment of the first ECC data and a partial parity. The controller 312 then sends the corrected data segment and the partial parity to the flash memory 314 during a time period $T_{74}$. The controller 312 then sends a program command to the flash memory 314 via the I/O bus during a time period $T_{75}$. During a time period $T_{76}$, the flash memory 314 amends the first ECC data according to the corrected data segment and the partial parity, stores the amended first ECC data to the second address, and the ready/busy signal is pulled low while the first ECC data is being stored. In comparison with the signal timings shown in FIG. 2, the operations 202 for transmitting the entire second ECC data from the controller to the flash memory is replaced by operations 702 for transmitting merely the corrected data segment and the partial parity. Thus, the operations 702 need a shorter time period than the operations 202, and the copy back operation shown in FIG. 7 is more efficient than that shown in FIG. 2.

Figure 8:
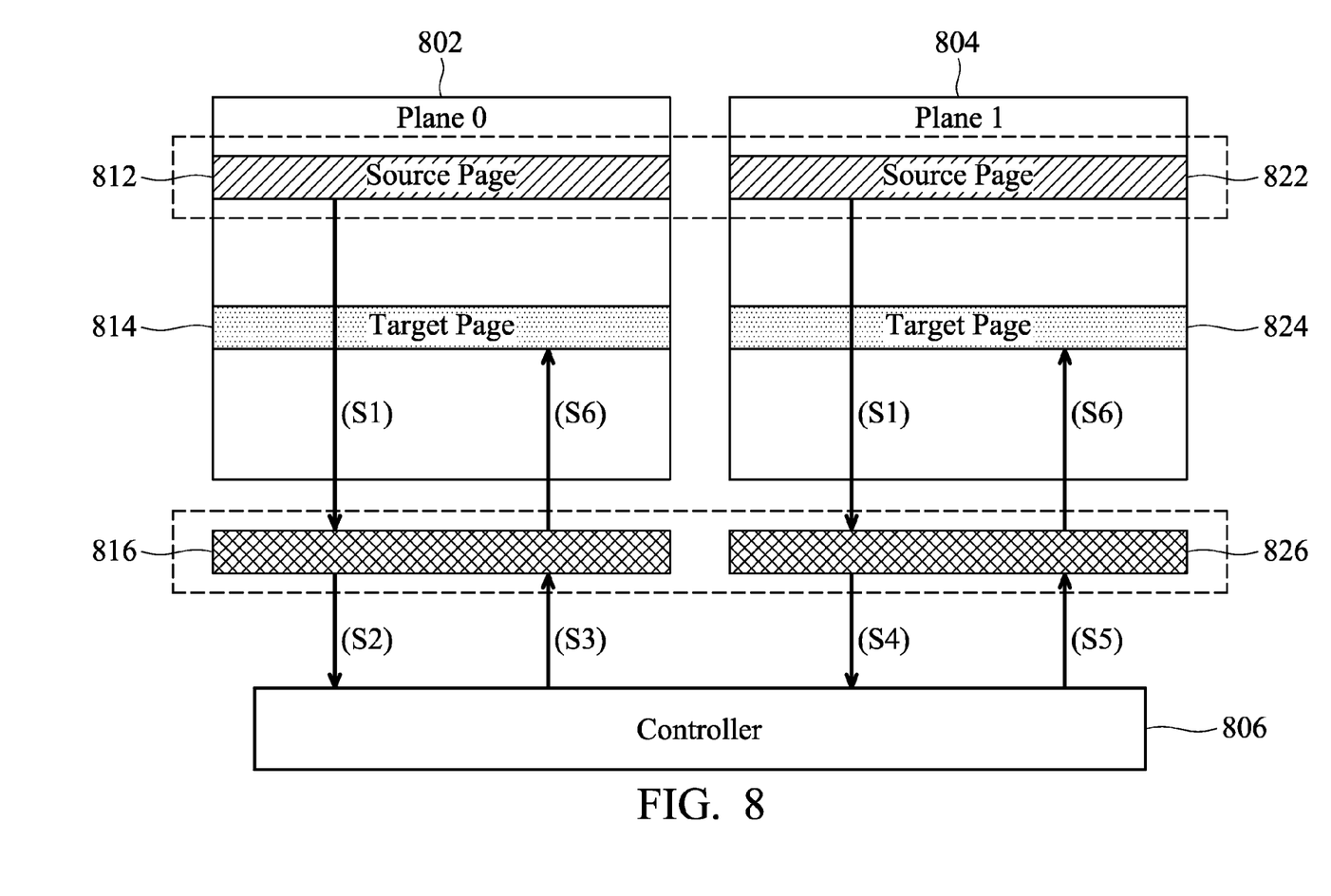
FIG. 8 is a schematic diagram of two flash memories operated in a two-plane mode.

In one embodiment, a flash storage device comprises a controller 806 and two flash memories, and the controller 806 accesses data stored in the flash memories in a two-plane mode. Referring to FIG. 8, a schematic diagram of two flash memories 802 and 804 operated in a two-plane mode is shown. A plane-0 flash memory 802 has the same capacity as that of a plane-1 flash memory 804. Assume that the controller 806 wants to perform a copy back operation on the two flash memories 802 and 804, thus the controller 806 first sends a 2-plane copy back command to the flash memories 802 and 804. The flash memories 802 and 804 then respectively reads data from the source pages 812 and 822 and stores the read-out data in buffers 816 and 826 (step S1). The buffer 816 of the plane-0 flash memory 802 then outputs the read-out data stored therein to the controller 806 (step S2). The controller 806 then corrects errors of the read-out data of the plane-0 flash memory 802 to obtain corrected data and then sends the corrected data back to the buffer 816 of the plane-0 flash memory 802 (step S3). The buffer 826 of the plane-1 flash memory 804 then outputs the read-out data stored therein to the controller (step S4). The controller then corrects errors of the read-out data of the plane-1 flash memory 804 to obtain corrected data and then sends the corrected data back to the buffer 826 of the plane-1 flash memory 804 (step S5). Finally, the controller 806 sends a 2-plane program command to the flash memories 802 and 804, and the flash memories 802 and 804 store the corrected data stored in buffers 816 and 826 to target pages 814 and 824.

It should be noted that if the buffers 816 and 826 are controller buffers implemented with the controller, the sequence of the steps described above can be 'step S2, step S3, step S4 and then step S5'. If the buffers 816 and 826 are flash buffers inside the flash memory, the sequence of the steps described above can be 'step S2, step S4, step S3 and then step S5'.

Figure 9A:
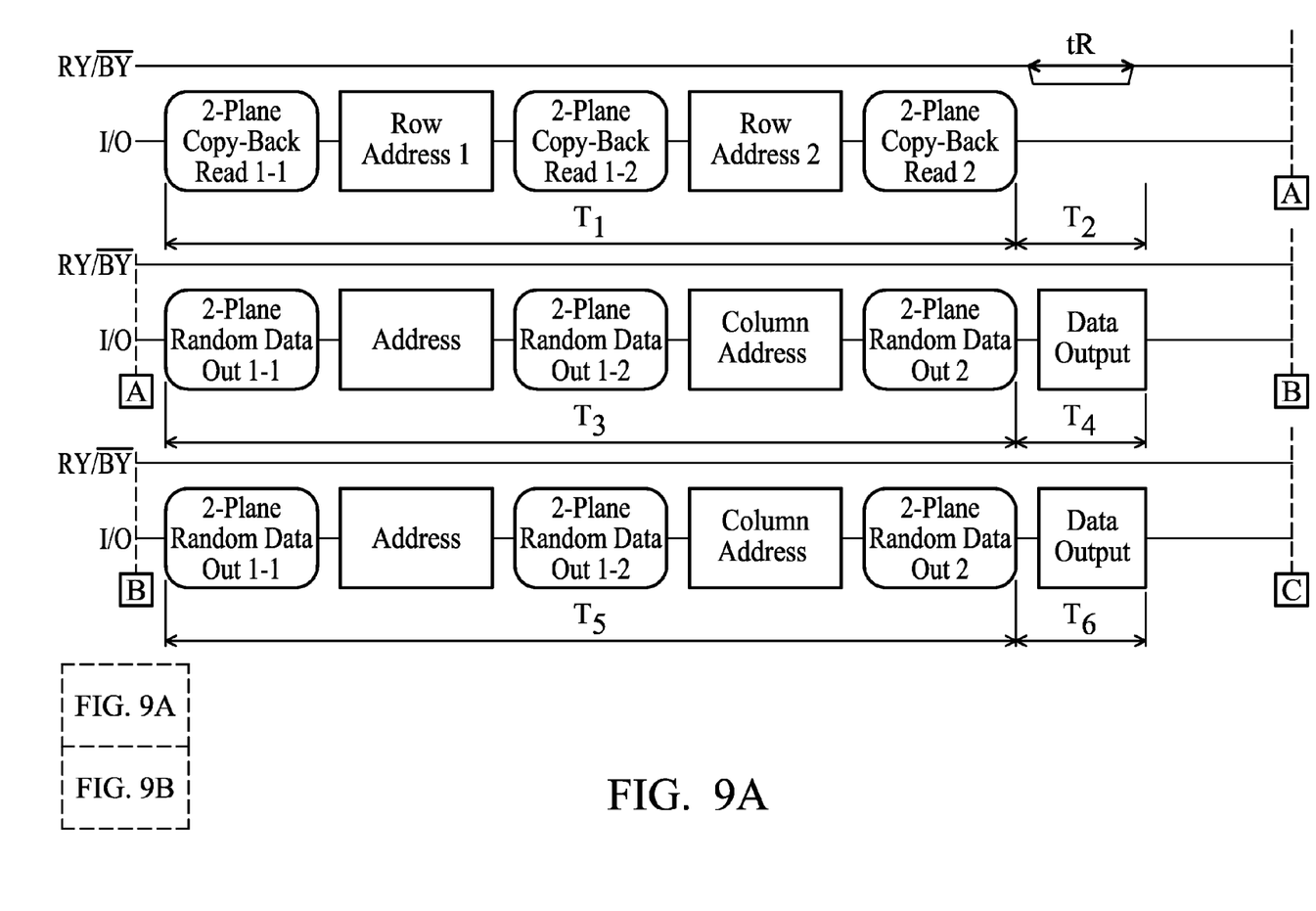
FIG. 9 is a schematic diagram of an embodiment of timing of signals transmitted between a controller and two flash memories operated in a 2-plane mode for performing copy back operations according to the invention.
Figure 9B:
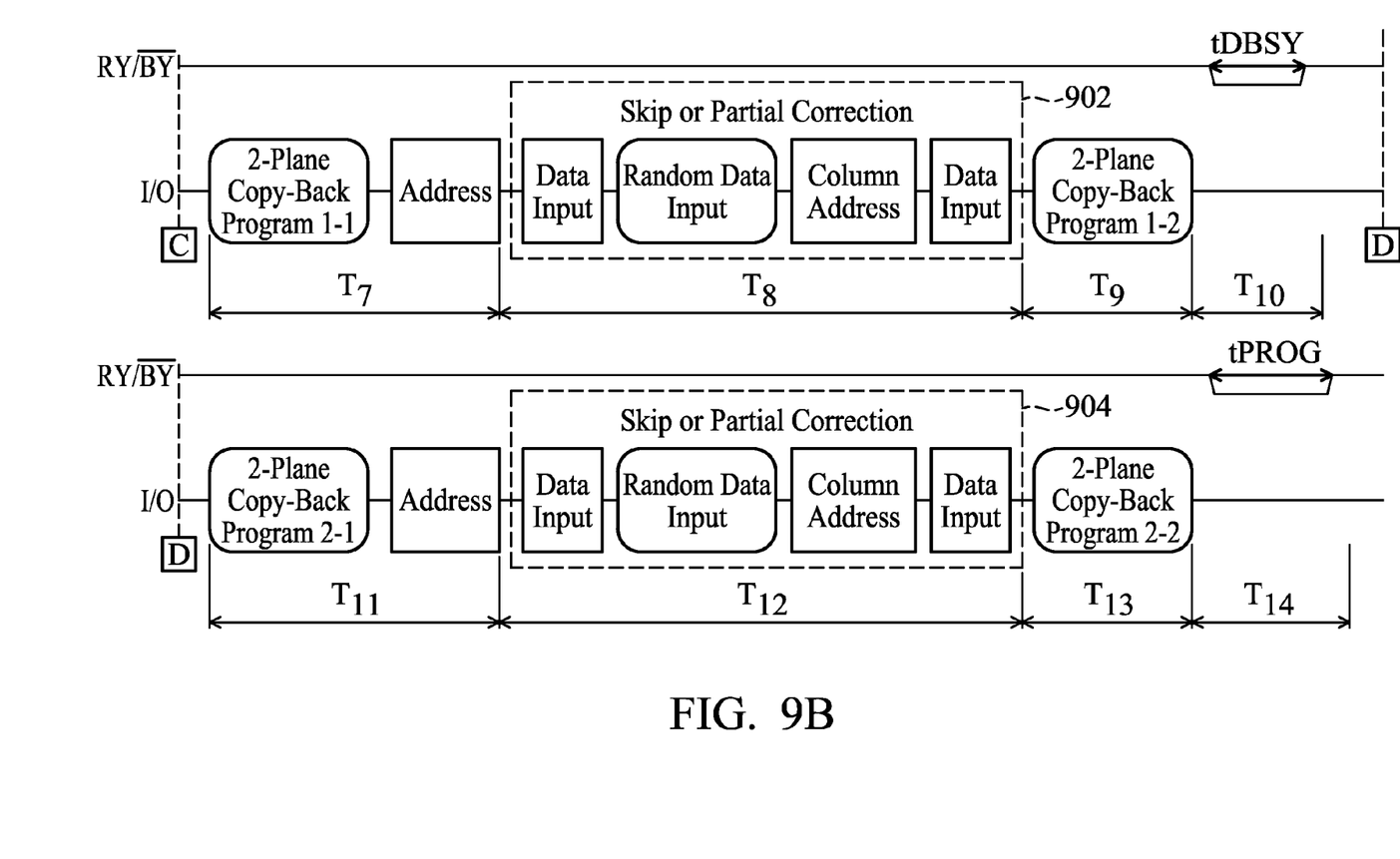

The flash memories operating in a 2-plane mode can also perform copy back operations according to the invention as the embodiments shown in FIGS. 4 and 6. Referring to FIG. 9, a schematic diagram of an embodiment of timing of signals transmitted between a controller and two flash memories 802 and 804 operated in a 2-plane mode for performing copy back operations according to an embodiment of the invention is shown. During a time period $T_1$, the controller sends a copy back command to the flash memories 802 and 804 via an input/output bus. During a time period $T_2$, the flash memories 802 and 804 respectively read first ECC data and second ECC data from the source pages 812 and 822, and a ready/busy signal transmitted to the controller is pulled low while the first ECC data is being read. The flash memory 802 then outputs first ECC data to the controller via the I/O bus during time periods $T_3$ and $T_4$. The flash memory 804 then also outputs second ECC data to the controller via the I/O bus during time periods $T_5$ and $T_6$.

The controller then calculates a first fail count of the first ECC data. If the first fail count of the first ECC data is less than a first threshold value, the controller directly sends a program command to the flash memory 802 via the I/O bus during time period $T_7$ and $T_9$, skipping the data transmission operation during a time period $T_8$. The flash memory 802 then stores the first ECC data to the target page 814 of plane 0. During a time period $T_{10}$, the flash memory switches an operational plane from the plane 0 to a plane 1, and the ready/busy signal is pulled low. If the first fail count of the first ECC data is greater than the first threshold value and less than a second threshold period, the controller also sends a corrected data segment and partial parity to the flash memory 802 during the time period $T_8$, and then sends a program command to the flash memory 802 during the time period $T_9$. After the flash memory 802 corrects the first ECC data according to the corrected data segment and the partial parity, the flash memory 802 stores the corrected first ECC data to the target page 814, and the ready/busy signal is pulled low while the corrected first ECC data is being stored during the time period $T_{10}$.

The controller then calculates a second fail count of the second ECC data. If the second fail count of the second ECC data is less than the first threshold value, the controller directly sends a program command to the flash memory 804 via the I/O bus during time periods $T_{11}$ and $T_{13}$, skipping the data transmission operation during a time period $T_{12}$. During a time period $T_{14}$, the flash memory 804 stores the second ECC data to the target page 824, and the ready/busy signal is pulled low while the second ECC data is being stored. If the second fail count of the second ECC data is greater than the first threshold value and less than the second threshold period, the controller also sends a corrected data segment and partial parity to the flash memory 804 during the time period $T_{12}$, and then sends a program command to the flash memory 804 during the time period $T_{13}$. After the flash memory 804 corrects the second ECC data according to the corrected data segment and the partial parity, and the flash memory 804 stores the corrected second ECC data to the target page 824. The ready/busy signal is then pulled low and the operational plane is switched back to the plane 0 during the time period $T_{14}$.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for performing copy back operations, comprising:
   sending a copy back command to a flash memory for reading a first error correction code (ECC) data from a first address;
   receiving the first error correction code from the flash memory;
   decoding the first ECC data without performing error correction to calculate a fail count of the first ECC data;
   comparing the fail count with a first threshold value, wherein when the fail count is less than the first threshold value, a first program command is sent to the flash memory for storing the first ECC data to a second address of the flash memory;
   comparing the fail count with a second threshold value;
   performing partial error correction when the fail count is greater than the first threshold value and less than the second threshold value,
   correcting at least one error segment of the first ECC data to obtain at least one corrected data segment;
   encoding a partial parity according to the corrected data segment;
   sending the corrected data segment and the partial parity to the flash memory; and
   after the flash memory amends the first ECC data according to the corrected data segment and the partial parity to obtain a second ECC data, sending a second program command to the flash memory for storing the second ECC data to the second address of the flash memory.

2. The method as claimed in claim 1, wherein the method further comprises:
   when the fail count is greater than the first threshold value, performing error correction;
   correcting errors of source data of the first ECC data to obtain corrected source data;
   encoding a parity according to the corrected source data and combining the corrected source data with the parity to obtain a second ECC data;
   sending the second ECC data to the flash memory; and
   sending a second program command to the flash memory for storing the second ECC data to the second address of the flash memory.

3. The method as claimed in claim 1, wherein the method further comprises:
   when the fail count is greater than the second threshold value, performing full error correction;
   correcting errors of source data of the first ECC data to obtain corrected source data;
   encoding a parity according to the corrected source data and combining the corrected source data with the parity to obtain the second ECC data;
   sending the second ECC data to the flash memory; and
   sending the second program command to the flash memory for storing the second ECC data to the second address of the flash memory.

4. The method as claimed in claim 1, wherein sending of the copy back command to the flash memory comprises sending the first address to the flash memory for reading the first ECC data from the first address.

5. The method as claimed in claim 1, wherein sending of the first program command to the flash memory comprises sending the second address to the flash memory for storing the first ECC data to the second address.

6. The method as claimed in claim 2, wherein the first ECC data and the second ECC data are Bose and Ray-Chaudhuri (BCH) codes or Reed-Solomon (RS) codes or Low Density Parity Check (LDOC) codes.

7. A flash storage device, comprising:
   a flash memory, storing a first error correction code (ECC) data at a first address; and
   a controller, sending a copy back command to the flash memory for reading the first ECC data, receiving the first ECC data from the flash memory, decoding the first ECC data without performing error correction to calculate a fail count of the first ECC data, comparing the fail count with a first threshold value;
   wherein when the fail count is less than the first threshold value, a first program command is sent to the flash memory for storing the first ECC data to a second address; wherein when the fail count is greater than the first threshold value and less than a second threshold value, the controller performs error correction, corrects errors of source data of the first ECC data to obtain corrected source data, encodes a parity according to the corrected source data, combines the corrected source data with the parity to obtain a second ECC data, sends the second ECC data to the flash memory, and sends a second program command to the flash memory for storing the second ECC data to the second address of the flash memory.

8. The flash storage device as claimed in claim 7, wherein when the fail count is greater than the first threshold value, the controller performs error correction, corrects errors of source data of the first ECC data to obtain corrected source data, encodes a parity according to the corrected source data, combines the corrected source data with the parity to obtain a second ECC data, sends the second ECC data to the flash memory, and sends a second program command to the flash memory for storing the second ECC data to the second address of the flash memory.

9. The flash storage device as claimed in claim 7, wherein when the fail count is greater than the second threshold value, the controller performs full error correction, corrects errors of source data of the first ECC data to obtain corrected source data, encodes a parity according to the corrected source data and combining the corrected source data with the parity to obtain the second ECC data, sends the second ECC data to the flash memory, and sends the second program command to the flash memory for storing the second ECC data to the second address of the flash memory.

10. The flash storage device as claimed in claim 7, wherein when the controller sends the copy back command to the flash memory, the controller also sends the first address to the flash memory for reading the first ECC data from the first address.

11. The flash storage device as claimed in claim 7, wherein when the controller sends the first program command to the flash memory, the controller also sends the second address to the flash memory for storing the first ECC data to the second address.

12. The flash storage device as claimed in claim 8, wherein the first ECC data and the second ECC data are Bose and Ray-Chaudhuri (BCH) codes or Reed-Solomon (RS) codes or Low Density Parity Check (LDOC) codes.

13. A method for performing copy back operations, comprising:
    sending a 2-plane copy back command to a first flash memory and a second flash memory for reading a first error correction code (ECC) data and for reading a second ECC data;
    receiving the first ECC data from the first flash memory;
    receiving the second ECC data from the second flash memory;
    decoding the first ECC data without performing error correction to calculate a first fail count of the first ECC data;
    when the first fail count is less than a first threshold value, sending a first program command to the first flash memory for storing the first ECC data to the flash memory;
    decoding the second ECC data to calculate a second fail count of the second ECC data;
    when the second fail count is less than the first threshold value, sending a second program command to the second flash memory for storing the second ECC data to the second flash memory, wherein the first ECC data is not sent back to the first flash memory when the first fail count is less than the first threshold value, and the second ECC data is not sent back to the second flash memory when the second fail count is less than the first threshold value;
    when the first fail count is greater than the first threshold value, comparing the fail count with a second threshold value, wherein the second threshold value is greater than the first threshold value;
    when the first fail count is less than the second threshold value, performing partial error correction;
    correcting at least one first error segment of the first ECC data to obtain at least one first corrected data segment;
    encoding a first partial parity according to the first corrected data segment;
    sending the first corrected data segment and the first partial parity to the first flash memory; and
    after the first flash memory amends the first ECC data according to the first corrected data segment and the first partial parity to obtain a third ECC data, sending a third program command to the first flash memory for storing the third ECC data to the first flash memory.

14. The method as claimed in claim 13, wherein the method further comprises:
    when the first fail count is greater than the first threshold value, performing error correction;
    correcting errors of source data of the first ECC data to obtain first corrected source data;
    encoding a first parity according to the first corrected source data and combining the first corrected source data with the first parity to obtain a third ECC data;
    sending the third ECC data to the first flash memory; and
    sending a third program command to the first flash memory for storing the third ECC data to the first flash memory.

15. The method as claimed in claim 13, wherein the method further comprises:
    when the second fail count is greater than the first threshold value, performing full error correction;
    correcting errors of source data of the second ECC data to obtain second corrected source data;
    encoding a second parity according to the second corrected source data and combining the second corrected source data with the second parity to obtain a fourth error correction code;
    sending the fourth error correction code to the second flash memory; and
    sending a fourth program command to the second flash memory for storing the fourth error correction code to the second flash memory.

16. The method as claimed in claim 13, wherein the method further comprises:
    when the second fail count is greater than the first threshold value, comparing the second fail count with a second threshold value, wherein the second threshold value is greater than the first threshold value;
    when the second fail count is less than the second threshold value, performing partial error correction;
    correcting at least one second error segment of the second ECC data to obtain at least one second corrected data segment;
    encoding a second partial parity according to the second corrected data segment;
    sending the second corrected data segment and the second partial parity to the second flash memory; and
    after the second flash memory amends the second ECC data according to the second corrected data segment and the second partial parity to obtain a fourth error correction code, sending a fourth program command to the second flash memory for storing the fourth error correction code to the second flash memory.

17. The method as claimed in claim 13, wherein the first ECC data and the second ECC data are Bose and Ray-Chaudhuri (BCH) codes or Reed-Solomon (RS) codes or Low Density Parity Check (LDOC) codes.

* * * * *